(12) United States Patent
Kawai et al.

(10) Patent No.: US 6,621,153 B2
(45) Date of Patent: Sep. 16, 2003

(54) COIN-SHAPED IC TAG

(75) Inventors: Wakahiro Kawai, Kyoto (JP); Yoshiki Iwamae, Kyoto (JP)

(73) Assignee: Omron Corporation, Kyoto-Fu (JP)

( * ) Notice: Subject to any disclaimer, the term of this patent is extended or adjusted under 35 U.S.C. 154(b) by 0 days.

(21) Appl. No.: 09/884,464

(22) Filed: Jun. 20, 2001

(65) Prior Publication Data

US 2002/0024439 A1 Feb. 28, 2002

(30) Foreign Application Priority Data

Jun. 21, 2000 (JP) ........................... 2000-186423

(51) Int. Cl.[7] .................. H01L 23/22; H01L 23/24; H01L 23/14; H01L 23/02; H01L 23/06; H01L 23/04; H01L 23/28; H01L 23/29

(52) U.S. Cl. .................. 257/679; 257/687; 257/702; 257/729; 257/730; 257/787; 257/788; 257/789; 257/790; 257/795

(58) Field of Search .................. 235/492, 487, 235/451, 793; 257/679, 687, 701, 702, 704, 729, 730, 787, 788, 789, 790, 795

(56) References Cited

U.S. PATENT DOCUMENTS 5,906,863 A * 5/1999 Lombardi et al. ........ 427/385.5
6,021,949 A * 2/2000 Boiron .................... 235/492
6,264,108 B1 * 7/2001 Baentsch .................. 235/487
6,264,109 B1   7/2001 Chapet et al.

FOREIGN PATENT DOCUMENTS

| EP | 0 350 179 A1 | 1/1990 |
| EP | 0 694 872 A1 | 1/1996 |
| FR | 2 760 330 A1 | 9/1998 |
| FR | 2 760 331 A1 | 9/1998 |
| JP | 02-101599 | 4/1990 |
| JP | 11-297520 | 10/1999 |

OTHER PUBLICATIONS

Hideyo, "Non–Contact IC Card and Manufacture Thereof," Patent Abstracts of Japan, vol. 1999, No. 04, Apr. 30, 1999, JP 11 001083, Jan. 6, 1999.

* cited by examiner

Primary Examiner—Nathan J. Flynn
Assistant Examiner—Victor A. Mandala, Jr.
(74) Attorney, Agent, or Firm—Foley & Lardner (57) ABSTRACT

A coin-shaped IC tag which can be endowed with a predetermined weight is described. The coin-shaped IC tag ensures a normal operation and affords a satisfactory feeling of weightiness as a value medium. The coin-shaped IC tag comprises an IC tag core. The IC tag core comprises an IC packaging base member including a base and an electronic circuit for communicating data and for recording data, the electronic circuit mounted on the base. The IC tag core also comprises a high specific gravity resin layer joined to the IC packaging base member.

32 Claims, 12 Drawing Sheets

COIN-SHAPED IC TAG

BACKGROUND OF THE INVENTION

Technical Field to Which the Invention Belongs

This invention relates to an IC tag which can record data based on communications and transmit recorded data. More particularly, it relates to a coin-shaped IC tag which is usable as a medium (a substitute for money) for paying out, for example, gaming mobile objects such as "pachinko (Japanese upright pinball game)" balls or medals for use in the game of a pachinko machine or a slot machine in a gaming hall, and a method of manufacturing the coin-shaped IC tag.

Heretofore, there have been circular IC tags each of which records data and also updates and transmits recorded data. Since, however, the general structure of the IC tag is fabricated by covering an IC module with a synthetic resin material, it is light in weight.

In the ordinary use of the IC tag, this IC tag is held by appropriate holding means, and hence, no fault is caused in the operation of communications. However, in a case where the IC tag is used as a substitute for a coin (cash), namely, as a value medium, and where it is thrown in and rolled in use similar to the coin, it cannot be stably rolled on account of its light weight. This poses the problem that inferior operations occur in the transmission and reception of data.

Another problem is that, when the IC tag is used as the substitute for the coin (cash), the IC tag feels less valuable due to the light weight.

SUMMARY OF THE INVENTION

According to aspect of an embodiment of the invention a coin-shaped IC tag can be endowed with a predetermined weight, thereby ensuring a normal operation and affording a satisfactory feeling of weightiness as a value medium. The invention also includes a method of manufacturing the coin-shaped IC tag.

According to one embodiment of the invention, there is provided a coin-shaped IC tag comprising an IC packaging base member in which an electronic circuit for communicating data and for recording data is mounted on a base material; a high specific gravity resin material whose specific gravity is increased by mixing a material of high specific gravity into a resin material, and which is formed into a flat shape; an IC tag core which is formed by joining the high specific gravity resin material in the flat shape and the IC packaging base member; and a covering which is formed of a resin material at, at least, an outer peripheral edge of a surface of the IC tag core so as to present a coin shape.

In one aspect of the present invention, the base material of the IC packaging base member includes any of an ordinary substrate, a resinous substrate, a resinous film, and other base materials each of which can mount the electronic circuit including an antenna.

In a further aspect of the present invention, the flat shape of the high specific gravity resin material includes, not only a disc shape, but also any of the shape of a triangle, a tetragon, and a polygon having five or more sides.

In a further aspect of the present invention, the IC tag core can also be formed by joining the IC packaging base member onto one surface of the high specific gravity resin material in the flat shape.

In a further aspect of the present invention, it is also possible to form two members out of the high specific gravity resin material in the flat shape, and to form the IC tag core by interposing the IC packaging base member between the two members.

In a further aspect of the present invention, as the covering of the IC tag core, the outer peripheral edge can be covered with the resin material so as to present the coin shape (for example, a circular shape or an oval shape).

In a further aspect of the present invention, one surface of the IC tag core can be covered in addition to the above covering of the outer peripheral edge. Further, a literal graphic (for example, the amount of money, the name of a hall, or a logogram) can be formed of the covering resin material.

In a further aspect of the present invention, the resin material for covering the surface of the IC tag core so as to present the coin shape can be a colorable resin material so as to prevent the appearance of the design of the coin-shaped IC tag from being spoiled due to the color of the IC tag core.

In a further aspect of the present invention, the IC tag core is worked by heating under pressure, whereby the interfaces of the two members of the high specific gravity resin material are brought into contact and are bonded by fusion bonding. More specifically, in a case where the base material of the IC packaging base member is formed of a resinous film and where the IC tag core is worked by heating under pressure, the resinous film of the IC packaging base member is fused and removed from the interfaces. When the heating under pressure is further continued, the interfaces of the two members of the high specific gravity resin material can be brought into contact and can be bonded by fusion bonding.

In a further aspect of the present invention, the IC packaging base member and the high specific gravity resin material can be bonded by fusion bonding in such a way that ultrasonic waves are projected onto the IC tag core.

In a further aspect of the present invention, the IC packaging base member is formed by coating both surfaces of the resinous film with a binder and mounting the electronic circuit on both the surface of the resinous film, and the IC packaging base member is interposed between two molded compacts formed of the high specific gravity resin material in the flat shape, whereby the IC packaging base member and the two molded compacts can be bonded by the binder so as to form the IC tag core. That is, when the binder for mounting the electronic circuit on the resinous film being the base material is applied onto both the surfaces of the resinous film, it can be utilized also for bonding the high specific gravity resin material.

In a further aspect of the present invention, the IC packaging base members are formed by successively mounting and arraying the electronic circuits on a resinous film having a tape shape, and the respective pairs of molded compacts are opposed to each other in correspondence with the mounted and arrayed electronic circuits from above and below the resinous film and are heated under pressure, whereby the pairs of molded compacts and the corresponding IC packaging base members can be bonded so as to form the IC tag cores and also to separate the IC tag cores from the tape-shaped resinous film. That is, the IC tag cores are separated from the tape-shaped resinous base material simultaneously with the bonding working based on the heating under pressure, whereby working for the separation can be dispensed with.

In a further aspect of the present invention, the IC packaging base members of the tape-shaped resinous film are continuously conveyed, and the respective pairs of molded compacts are supplied during the conveyance, whereby the IC tag cores can be successively manufactured. That is, the IC tag cores can be mass-produced.

In a further aspect of the present invention, the coin-shaped IC tag according to this invention can be manufactured by injection molding in such a way that the IC tag core is inserted in a metal mold into which the covering resin material is poured.

In a further aspect of the present invention, the outer surface of each of the two molded compacts made of the high specific gravity resin material, except the interface thereof, is covered with the covering resin material by, for example, injection molding (dichroic molding), and the IC packaging base member is interposed between the two molded compacts, whereupon the molded compacts and the IC packaging base member can be bonded.

According to another embodiment of the invention there is provided a coin-shaped IC tag. The coin-shaped IC tag comprises: an IC packaging base member in which an electronic circuit for communicating data and for recording data is mounted on a base material; a high specific gravity resin material whose specific gravity is increased by mixing a material of high specific gravity into a resin material, and which is formed into a flat shape; an IC tag core which is formed by joining the high specific gravity resin material in the flat shape and said IC packaging base member; and a covering which is formed of a resin material at, at least, an outer peripheral edge of a surface of said IC tag core so as to present a coin shape.

According to another embodiment of the invention there is provided a coin-shaped IC tag. The coin-shaped IC tag comprises: an IC tag core, the IC tag core comprising: an IC packaging base member including a base and an electronic circuit for communicating data and for recording data, the electronic circuit mounted on the base; a high specific gravity resin layer joined to the IC packaging base member, the high specific gravity resin layer having a specific gravity greater than about 2.

According to another embodiment of the invention there is provided a method of manufacturing a coin-shaped IC tag. The method comprises the steps of: forming an IC packaging base member, the IC packaging base member including an electronic circuit for communicating data and for recording data and a resinous base with the electronic circuit mounted thereon; providing a first high specific gravity resin member on a first side of the IC packaging base member and a second high specific gravity resin member on a second side of the IC packaging base member; and bonding the first and second high specific gravity base members and the resinous base.

According to another embodiment of the invention there is provided a method of manufacturing a coin-shaped IC tag. The method comprises the steps of: coating a first side and a second side of a resinous base with a binder; mounting an electronic circuit for communicating data and recording data on the resinous base; applying a first high specific gravity resin member on the first side and a second high specific gravity resin member on the second side whereby the first and second high specific gravity resin members are bonded by the binder.

According to another embodiment of the invention there is provided a method of manufacturing a coin-shaped IC tag. The method comprises the steps of: coating a first side and a second side of a resinous base with a binder; mounting an electronic circuit for communicating data and recording data on the resinous base; applying a first high specific gravity resin member on the first side and a second high specific gravity resin member on the second side whereby the first and second high specific gravity resin members are bonded by the binder.

According to another embodiment of the invention there is provided a method of manufacturing a coin-shaped IC tag. The method comprises the steps of: successively mounting and arraying electronic circuits on a tape-shaped resinous film to provide a plurality of IC packaging base members; arranging respective pairs of high specific gravity resin members on opposing sides of a respective IC packaging base member of the plurality of base members; and bonding respective pairs of high specific gravity resin members with a respective IC packaging base member of the plurality of base members to form a plurality of IC tag cores.

According to another embodiment of the invention there is provided a method of manufacturing a coin-shaped IC tag. The method comprises the steps of: providing an IC tag core, the IC tag core comprising: an IC packaging base member including a base and an electronic circuit for communicating data and for recording data, the electronic circuit mounted on the base; and a high specific gravity resin layer joined to the IC packaging base member; and covering the IC tag core with a covering resin.

The different aspects of performance of the coin-shaped IC tag according to this invention can be combined as desired.

BRIEF DESCRIPTION OF THE DRAWINGS

FIGS. 11 (a) and 11 (b) are sectional views for explaining the manufacturing steps of another example of a coin-shaped IC tag for an IC tag according to an embodiment of the invention.

Explanation of Symbols

10 . . . coin-shaped IC tag
20 . . . IC tag core
21 . . . high specific gravity resin material
21a . . . molded compact
22 . . . IC packaging film
22a . . . antenna coil
22e . . . electronic module
30 . . . covering resin

DETAILED DESCRIPTION OF THE PREFERRED EMBODIMENTS

A predetermined weight may be bestowed to an IC tag by embedding a metal plate in the IC tag or by snugly fitting a metal crown on the outer peripheral part of the IC tag. Since, however, the IC tag includes a coiled antenna as communication means, the above metal plate or metal crown hinders the transmission and reception of electromagnetic waves and is ineffective for the solution.

Functions and Effects of the Invention

According to the coin-shaped IC tag of this invention, since the coin-shaped IC tag can be endowed with a set weight, it ensures a normal operation without an inferior operation ascribable to an insufficient weight, even if the IC tag is used as a substitute for cash. Moreover, since the coin-shaped IC tag can afford a satisfactory feeling of weightiness as a value medium, it does not degrade the feeling of valuableness as the substitute for cash. Accordingly, the coin-shaped IC tag can attain the satisfactory functions as the substitute for cash.

An embodiment of this invention will now be described in detail in conjunction with the drawings.

The drawings show a coin-shaped IC tag which is used as a substitute for cash in a gaming hall, and which is used as a value medium by storing value data therein, and a method of manufacturing the coin-shaped IC tag. For example the IC tag may store a value corresponding to currency, such as Japanese yen or U.S. dollars.

Figure 1:
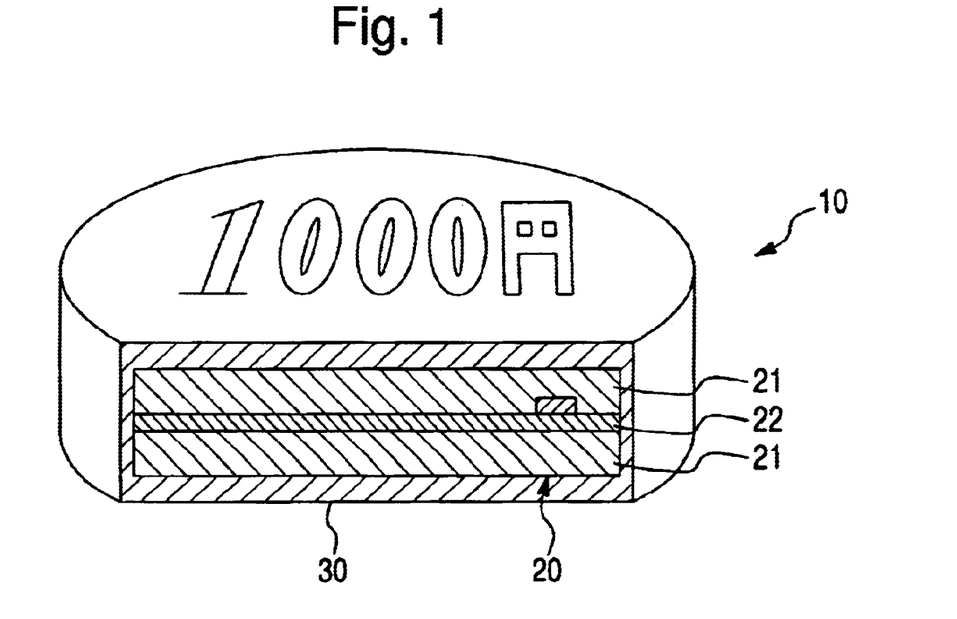
FIG. 1 is a perspective view, partly in section, of a coin-shaped IC tag according to an embodiment of the invention.

FIG. 1 shows the coin-shaped IC tag 10 mentioned above. The IC tag 10 is formed of an IC tag core 20, and a colorable covering resin 30 which covers the IC tag core 20. The shape of the coin-shaped IC tag 10 is set at an outside diameter of, for example, 30 mm and a thickness of, for example, 2 mm.

Figure 15:
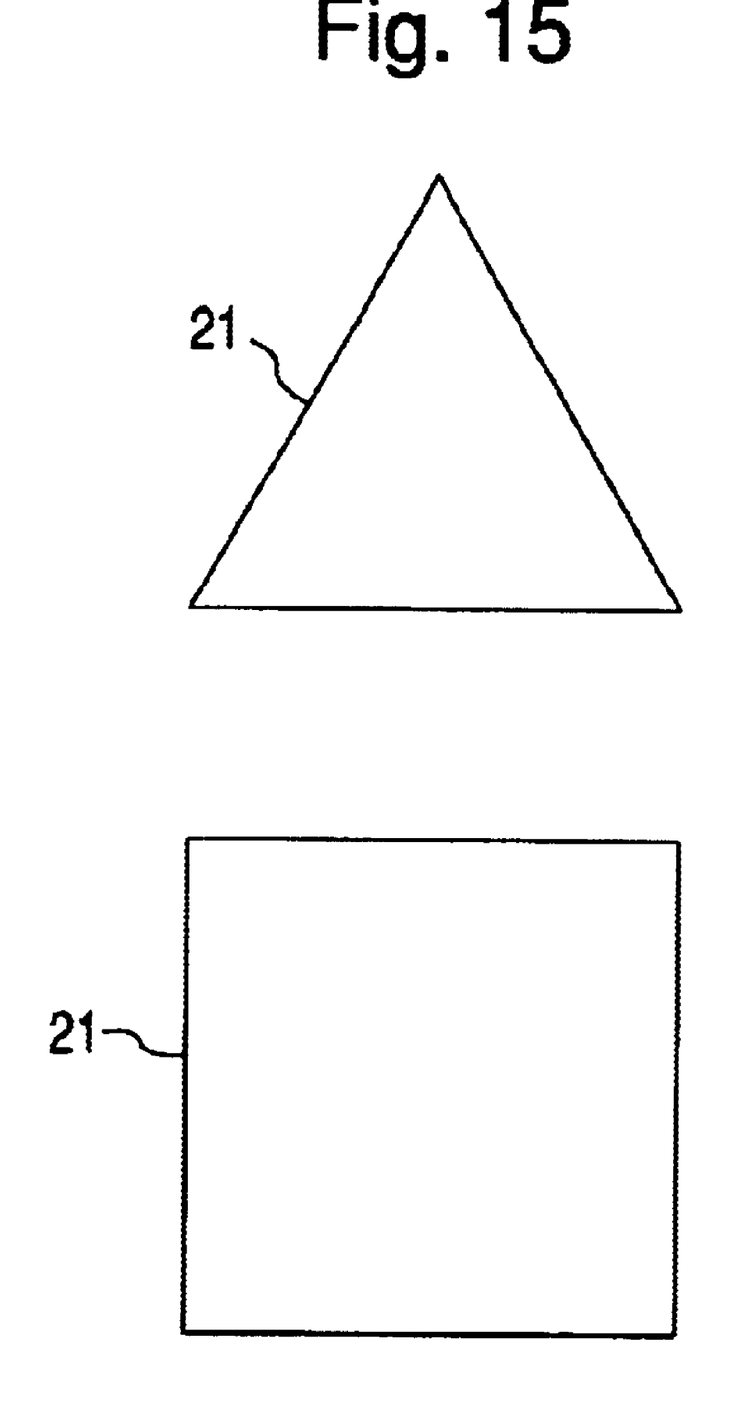
FIG. 15 is a side view illustrating examples of the shape of a high specific gravity resin material coin-shaped IC tag for an IC tag according to an embodiment of the invention.

The above IC tag core 20 is formed of two members of high specific gravity resin material 21 each of which is formed in a disc shape (a flat example), and an IC packaging film 22 which is interposed and joined between the resin material members 21. The high specific gravity resin material may also have a shape of a triangle or tetragon (See FIG. 15). A resinous film may be used as a base material for packaging the electronic circuit (such as IC) of the above IC packaging film 22.

Figure 2:
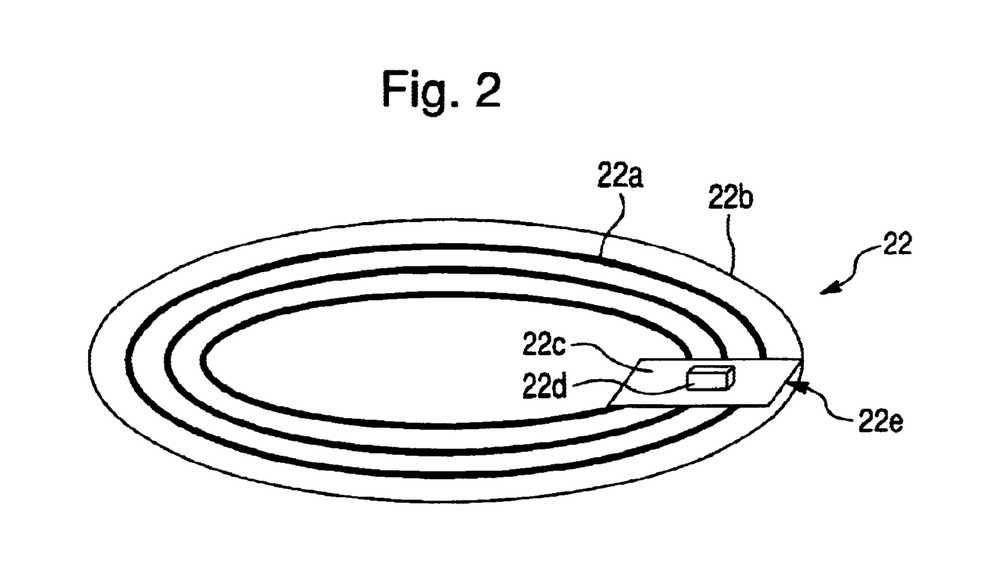
FIG. 2 is a perspective view of an IC packaging film for an IC tag according to an embodiment of the invention.

FIG. 2 shows the above IC packaging film 22. The IC packaging film 22 is fabricated in such a way that an antenna coil 22a which is formed in a spiral shape by etching Cu (copper), for example, 9 $\mu$m thick is formed on one surface of a film 22b made of a PET (polyethylene terephthalate) resin, for example, 38 $\mu$m thick. An electronic module 22e in which a bare chip IC 22d is packaged on a PET film base material 22c, for example, 25 $\mu$m thick is mounted on the upper surface of the above antenna coil 22a.

Figure 3:
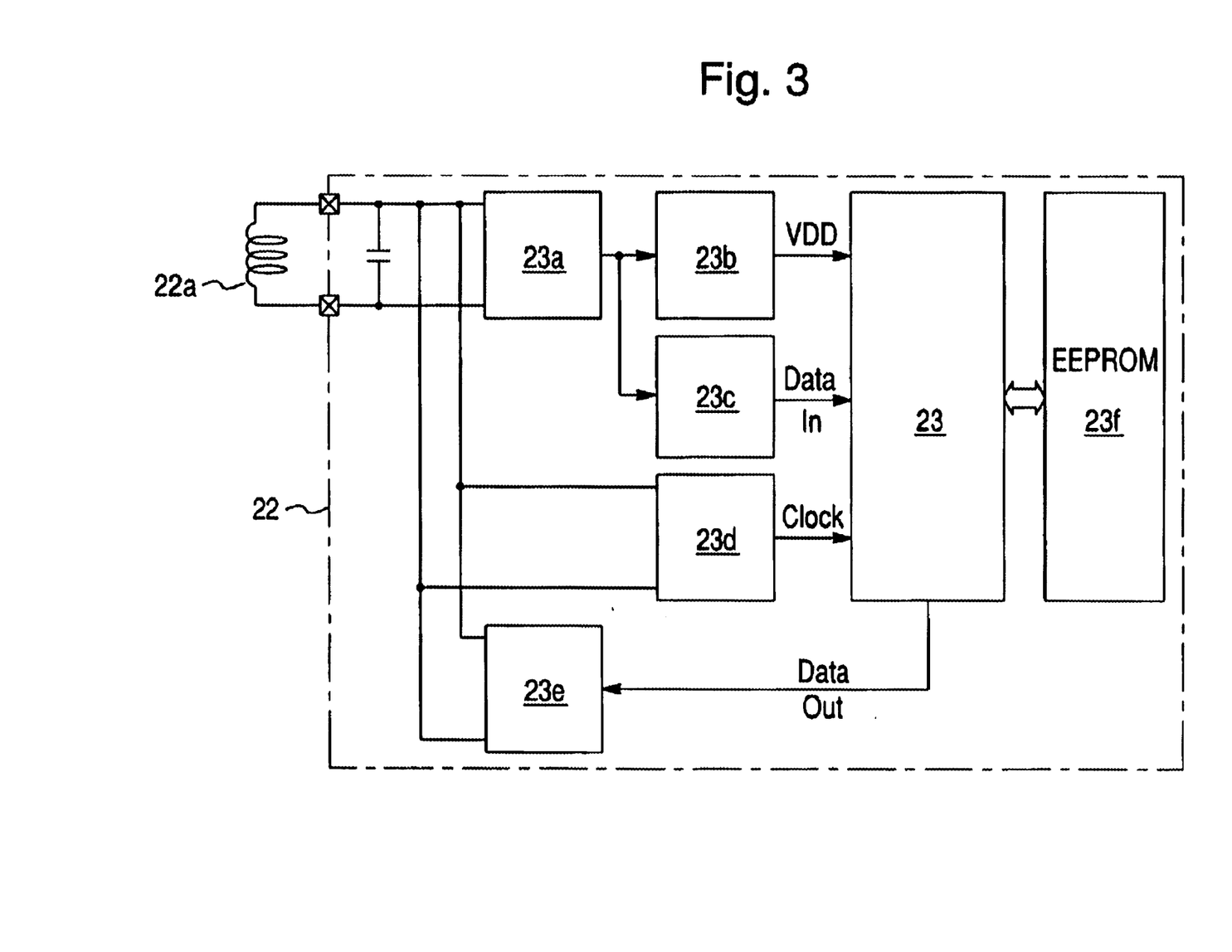
FIG. 3 is a block diagram of the control circuit arrangement of an electronic module for an IC tag according to an embodiment of the invention.

FIG. 3 shows the circuit arrangement (electronic circuit) of the above electronic module 22e. A control circuit 23 is one which is formed of, for example, a CPU, a ROM, a RAM etc. and which drives and controls individual circuit devices. A rectification circuit 23a rectifies the signal of an electromagnetic wave received by the antenna coil 22a. A regulated voltage circuit 23b generates a DC supply voltage of regulated voltage on the basis of an electromotive force produced across the antenna coil 22a and feeds the supply voltage to individual circuits.

A demodulation circuit 23c demodulates a signal from the rectification circuit 23a into digital data. A clock generation circuit 23d generates clock pulses for use in data processing, and a modulation circuit 23e modulates digital data to-be-transmitted, into a transmissible signal.

The circuit arrangement also includes an EEPROM 23f, i.e., a nonvolatile storage medium, in which data are stored so as to be readable.

When the signal is received by the antenna 22a, the above control circuit 23 decodes the data demodulated by the demodulation circuit 23c. In accordance with the decoded data, the control circuit 23 stores or reads out the data in or from the EEPROM 23f, and it performs the control of transmitting the data to-be-transmitted through the antenna 22a after the modulation thereof by the modulation circuit 23e.

FIGS. 4(a) through 4(d) show the manufacturing steps of the antenna coil 22a included in the IC packaging film 22.

Figure 4A:
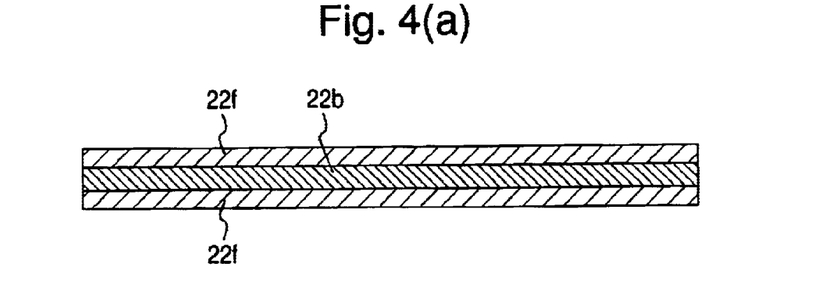
FIGS. 4(a) through 4(d) are sectional views for explaining the manufacturing steps of an antenna coil for an IC tag according to an embodiment of the invention.

As shown in FIG. 4(a), both the surfaces of the PET film 22b being, for example, 25 $\mu$m thick, are coated with layers of a urethane-based binder 22f, for example, by a roll coater method or the like so that each binder layer 22f may be about 10 $\mu$m thick.

The above binder layers 22f serve, not only for bonding a copper foil 22g, but also for bonding the high specific gravity resin material 21 as will be explained later.

Figure 4B:
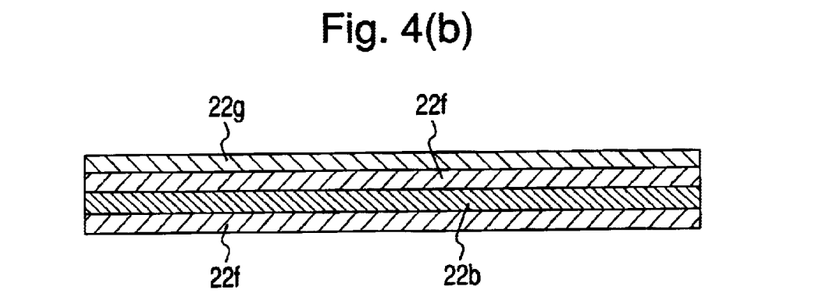

As shown in FIG. 4(b), the copper foil 22g being, for example, 9 $\mu$m thick, is put on one surface of the PET film 22b, and it is stacked and bonded thereonto via a thermal lamination performed under the conditions of a temperature of 150° C. and a pressure of 5 kg/cm$^2$.

Figure 4C:
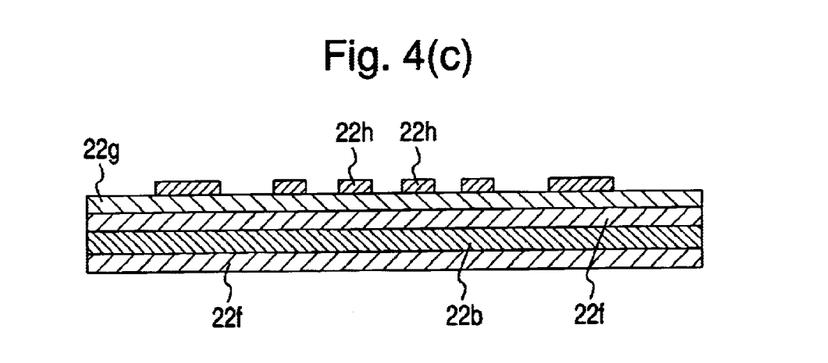

As shown in FIG. 4(c), an etching resist pattern for the coil antenna 22a is printed and formed on the surface of the above stacked copper foil member. More specifically, an insulating etching resist ink 22h is printed on the copper foil 22g in a coil shape which has the number of turns, a line width, a pitch, and inside and outside diameters for attaining an L-value and a Q-value required as the characteristics of the antenna coil 22a, by employing, for example, gravure printing.

Used as the above etching resist ink 22h is an ink which is cured by heat or an active energy radiation. The active energy radiation may be ultraviolet radiation or electron rays, for example. In case of employing ultraviolet radiation, a photopolymerizer is mixed into the resist ink.

Figure 4D:
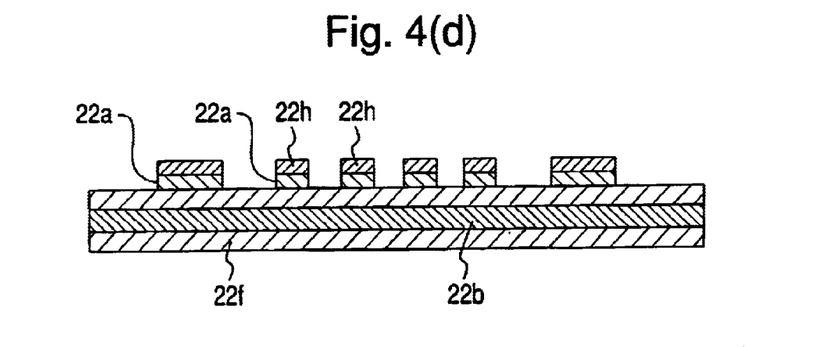

As shown in FIG. 4(d), that part of the copper foil 22g which is not covered with the etching resist pattern formed by the preceding step is removed by a known etching process, whereby the antenna coil 22a is formed.

For example, in the above etching process, the copper foil 22g may be removed using $FeCl_2$ (120 gr./lit.) as an etchant under the condition of a temperature of 50° C.

After the etching process as explained above, the etching resist ink 22h is removed by a known process, whereby the film bearing the antenna coil can be obtained. The electron module 22e explained before is mounted on the film so as to form the IC packaging film 22.

When a bonding method based on ultrasonic waves is adopted in the above mounting of the electron module 22e, the etching resist ink 22h lying between electrical connection terminals is removed by mechanical friction based on the ultrasonic waves. Therefore, the IC packaging film 22 can be fabricated without the etching resist removal process.

Figure 5A:
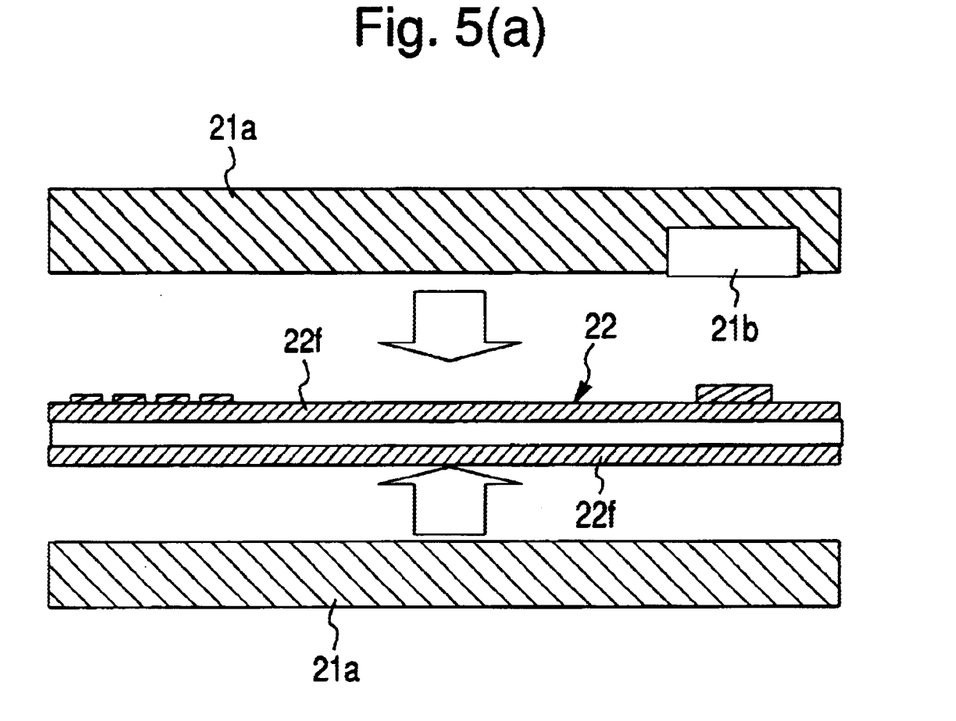
FIGS. 5(a) and 5(b) are sectional views for explaining the manufacturing steps of an IC tag core for an IC tag according to an embodiment of the invention.
Figure 5B:
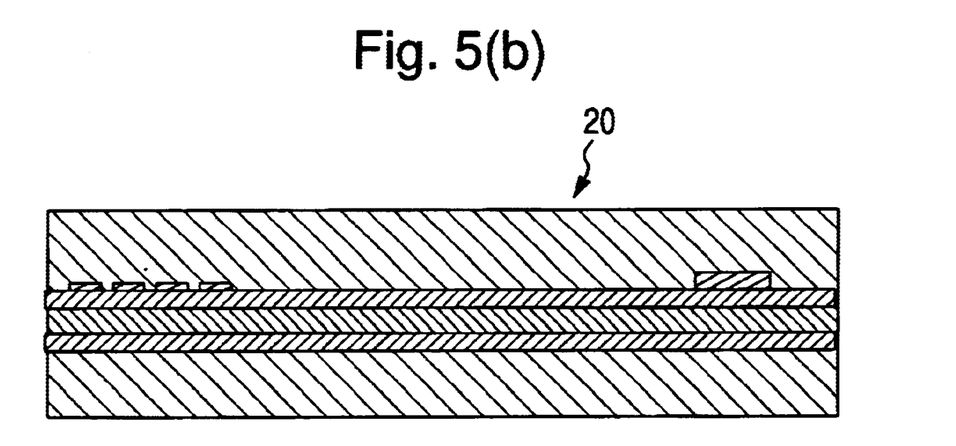

FIGS. 5(a) and 5(b) show the manufacturing steps of the IC tag core 20 explained before. First, two molded compacts 21a, each of which is formed of the high specific gravity resin material 21 into a disc shape (a flat example) are prepared beforehand. The high specific gravity resin material may have a specific gravity of greater than about 2. In certain applications the high specific gravity resin may have a specific gravity less than about 8 so that communication properties of the coin-shaped IC tag are not inhibited. The high specific gravity resin material 21 may be a material in which a high specific gravity material, such as a powder of tungsten (W) or stainless steel (such as "SUS304") is dispersed and packed using, for example, a nylon 6 (polyamide) resin as a binder. There are a variety of other high specific gravity materials which may be dispensed in the resin including tantalum (Ta) and ZnO. Other binders include PBT and PPS. Preferably the binder materials have good bonding properties to the high specific gravity material. The molded compacts 21a may be made by subjecting the resin material 21 to injection molding which is performed under the conditions of, for example, a cylinder temperature of 270–280° C. and a metal mold temperature of 80° C. Alternatively, the molded compacts 21a may be made by cutting them out of the high specific gravity resin material 21 which is formed in the shape of a bar. This method, however, is not suited for mass production.

The selection of either the metal tungsten (W) or stainless steel (such as "SUS304") and the proportion thereof in the resin material 21 are determined in correspondence with the desired weight of the coin-shaped tag 10. Besides, one molded compact 21a is formed with a recess 21b for accommodating the bare chip IC 22d of the electronic module 22e (refer to FIG. 2), at the same time as the molding thereof.

The IC packaging film 22 is sandwiched in between the two molded compacts 21a as shown in FIG. 5(a), and it is sealed as shown in FIG. 5(b). Then, the IC tag core 20 is fabricated.

More specifically, the IC packaging film 22 is arranged between the molded compacts 21a and the resulting structure is loaded with a pressure of 20 kg/cm$^2$ for about 5 seconds in a state where it is held at a temperature of 120–200° C. Owing to this treatment, the urethane-based binder layers 22f at both the surfaces of the IC packaging film 22 are melted and are caused to flow under pressure. The binder layers 22f are cured by subsequent cooling. Therefore, the three constituents of the upper and lower molded compacts 21a and the IC packaging film 22 are bonded, whereby the IC tag core 20 is fabricated.

At the above bonding step, the process is carried out with the bare chip IC 22d of the electronic module 22e received in the recess 21b, so that the breakage of the bare chip IC 22d attributed to the pressure load can be avoided.

Figure 6A:
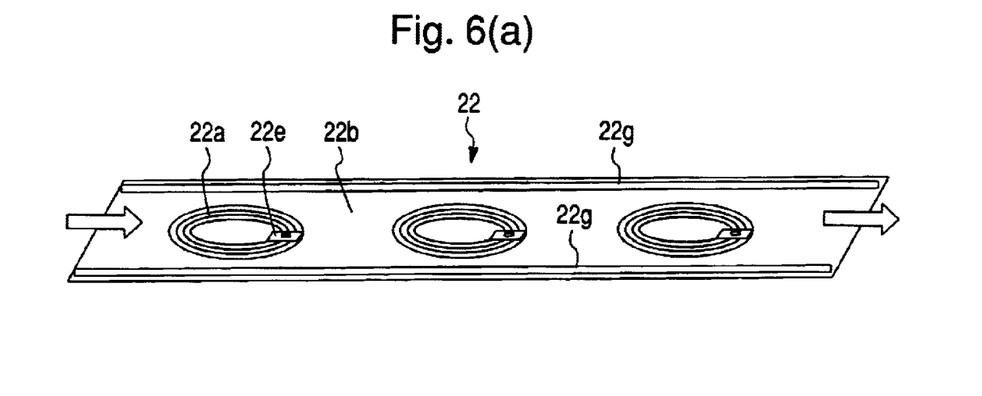
FIGS. 6(a) through 6(c) are exploded perspective views for explaining the manufacturing steps of IC tag cores for an IC tag according to an embodiment of the invention.
Figure 6B:
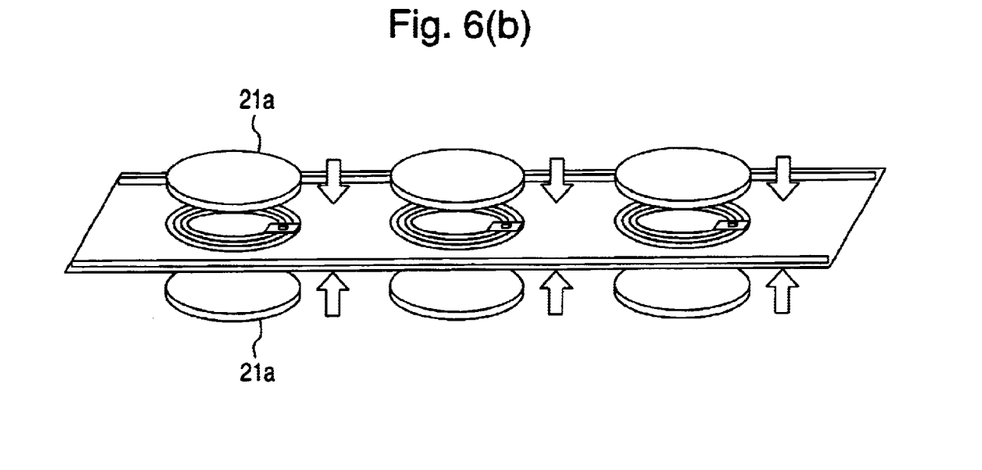
Figure 6C:
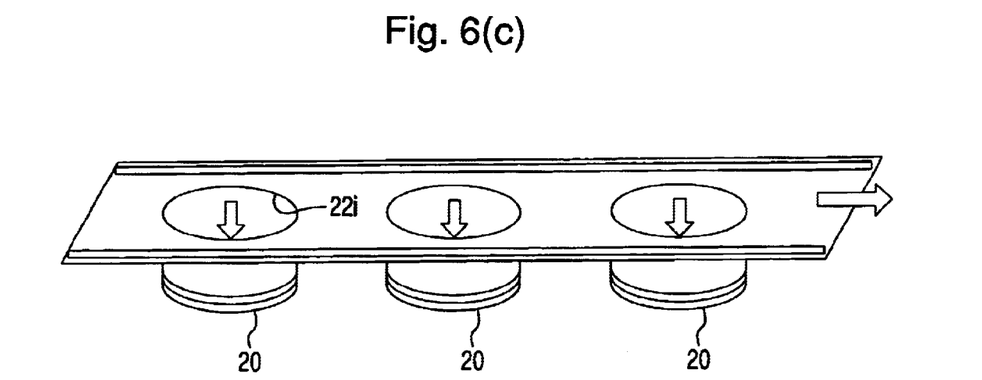

FIGS. 6(a) through 6(c) show a concept for the mass production of the IC tag cores 20.

As shown in FIG. 6(a), the IC packaging films 22 are fabricated in such a way that the antenna coils 22a and the electronic modules 22e are successively arrayed and mounted at predetermined intervals on the film 22b made of the PET resin which is tape-shaped. In the fabrication, the antenna coils 22a can be formed by employing a method in which an etching mask is formed by gravure printing, followed by the etching of the copper foil 22g, and the electronic modules 22e are thereafter mounted.

Incidentally, the copper foil 22g is left behind in the shape of stripes on both the sides of the tape 22b. Thus, the tension limit of the tape-shaped PET resin film 22b can be increased by the stripes of the copper foil 22g, and stable successive working can be realized.

As shown in FIG. 6(b), the molded compacts 21a formed of the high specific gravity resin material 21 beforehand are supplied from above and below the tape-shaped PET resin film 22b under positioned conditions, and the three constituents (the molded compacts 21a and the tape-shaped PET resin film 22b) are joined. A treatment is performed by heating and pressing under the conditions explained with reference to FIG. 5(a), whereby the three constituents of the upper and lower molded compacts 21a and the IC packaging films 22 are bonded to fabricate the IC tag cores 20.

As shown in FIG. 6(c), those parts of the tape-shaped PET resin film 22b which surround and support the IC packaging films 22 are melted and shrunk by the above heating and pressing treatment, and the fabricated IC tag cores 20 are separated. Therefore, the IC packaging films 22 can be pulled out downwards without requiring post-working, for example, by separation by a tool such as cutter or a puncher. In FIG. 6(c), symbol 22i denotes a trace (or hole) formed after the pulling-out of the IC packaging film 22.

Figure 7:
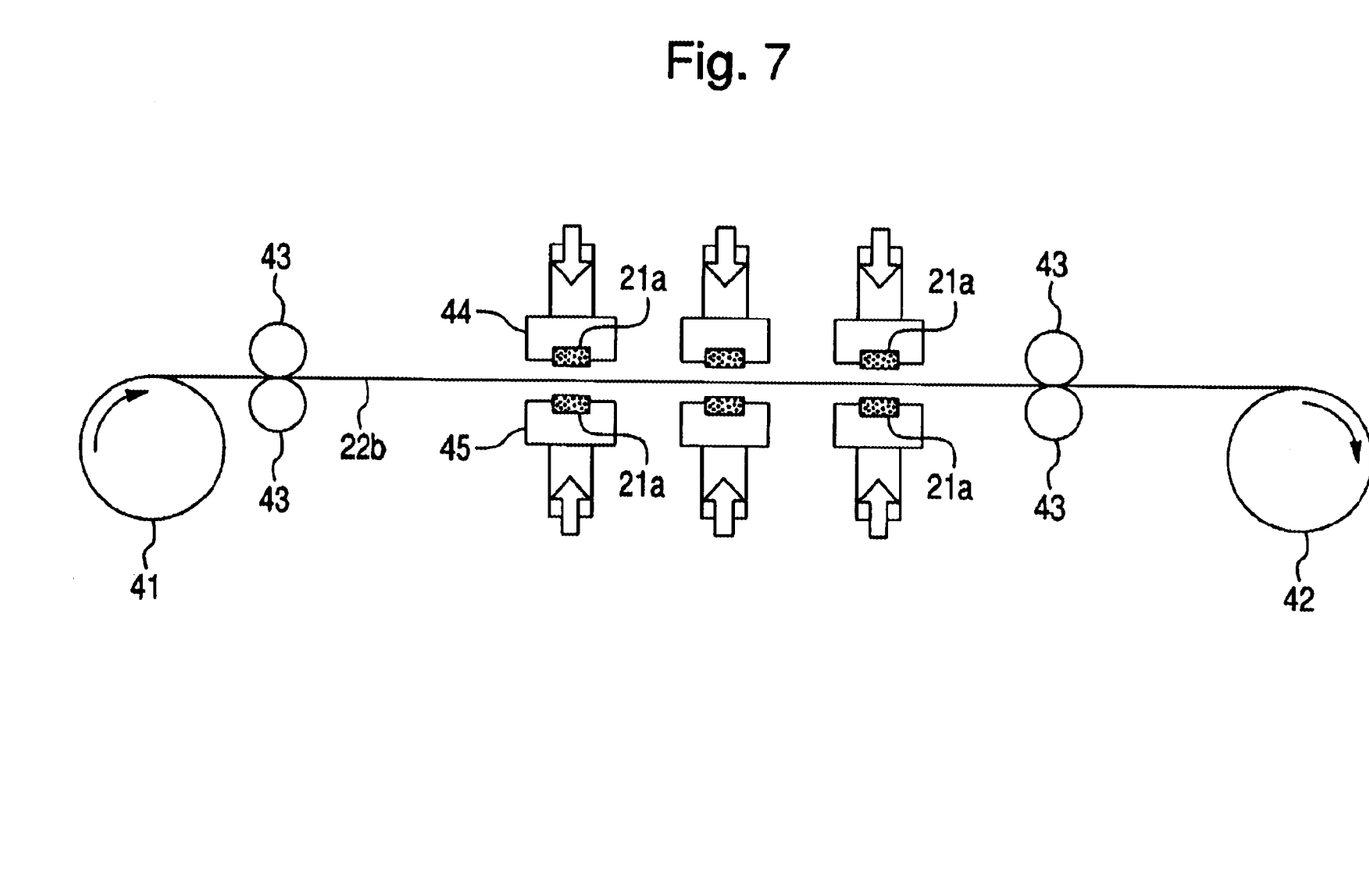
FIG. 7 is a schematic side view of the manufacturing equipment of IC tag cores for an IC tag according to an embodiment of the invention.

FIG. 7 shows a schematic construction of an apparatus for mass-producing the IC tag cores 20.

The tape-shaped PET resin film 22b is conveyed from a delivery drum 41 to a take-up drum 42 by roll feeders 43 intermittently at intervals permitting the molded compacts 21a to be joined. The molded compacts 21a are supplied during the conveyance of the tape 22b.

Each pair of molded compacts 21a mentioned above is respectively held by holders 44, 45 disposed above and below film 22b, and are respectively supplied to the positions of the tape-shaped film 22b corresponding to the IC packaging films 22. Each of the holders 44, 45 includes heating means (not shown). The upper holder 44 performs vertical movements by a suitable cylinder mechanism (not shown) and presses the tape-shaped film 22b under a predetermined pressure. The mass production of the IC tag cores 20 as shown in FIGS. 6(a) through 6(c) can be realized by such an aspect of the apparatus.

Figure 8A:
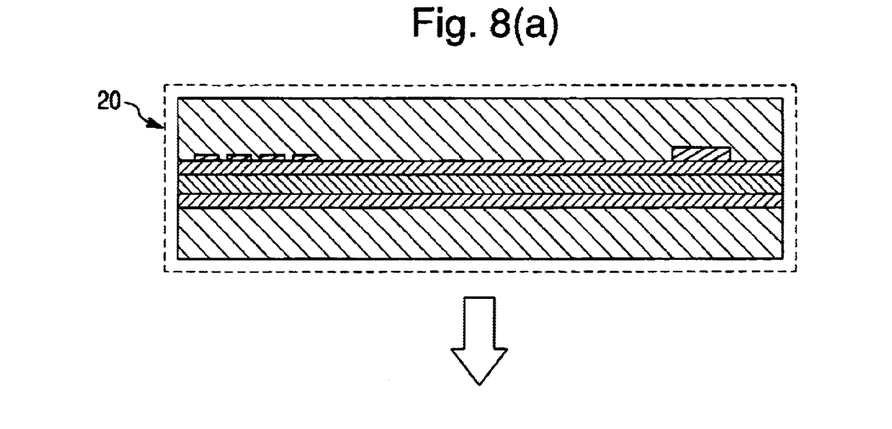
FIGS. 8(a) through 8(c) are sectional views for explaining the manufacturing steps of a coin-shaped IC tag for an IC tag according to an embodiment of the invention.
Figure 8B:
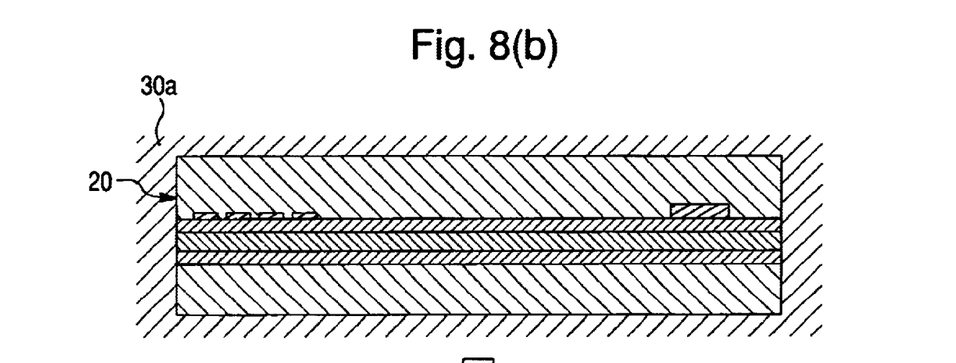
Figure 8C:
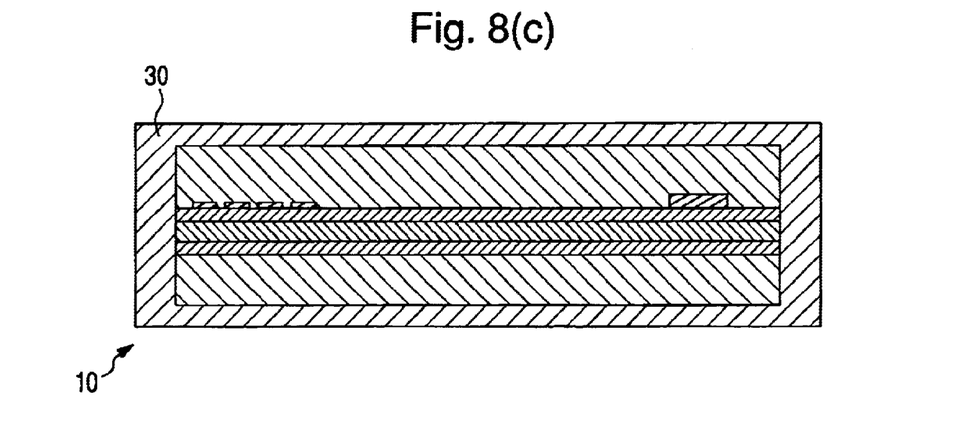

FIGS. 8(a) through 8(c) show working steps for manufacturing the coin-shaped IC tag 10 in such a way that the whole surface of the IC tag core 20 produced by the above process is covered with a colorable covering resin 30. More specifically, the molded compacts 21a for forming the IC tag core 20 are made of the high specific gravity resin material 21 in which, for example, metal powder of tungsten (W) or stainless steel (such as "SUS304") is dispersed and mixed. Accordingly, even when the binder resin of the resin material 21 is colored, a desired tint is difficult to be obtained. Therefore, the covering resin 30 is formed by covering the surface of the IC tag core 20 with a colorable resin in accordance with a method explained below.

In this example a hard coat material (for example, an urethane-acrylate-based UV curable resin) is applied as the covering resin 30 in consideration of the scratch resistance of the surface. As shown in FIG. 8(a), nylon (polyamide resin), for example, is used as the main ingredient (binder) of the high specific gravity resin material 21 constituting the IC tag core 20, and the whole surface of the IC tag core 20 formed of the resin 21 is processed by exposing to a plasma of oxygen, nitrogen, an inert gas or the like so as to be endowed with a critical surface tension of at least 55 dynes/cm.

Subsequently, as shown in FIG. 8(b), the surface of the IC tag core 20 is coated with a hard coat material 30a by spraying, dipping, a roll coater method or the like.

In the case where the spraying is employed as the coating method, the hard coat material 30a may be dried at 60° C. for about 1–3 minutes so as to sufficiently volatilize its solvent. Then, subsequent cracking can be suppressed, and the coating with high hardness can be obtained.

As shown in FIG. 8(c), the above applied hard coat material 30a is irradiated with UV radiation so as to completely cure the coating film. The UV irradiation on this occasion is carried out by, for example, a high-pressure mercury vapor lamp of 80 W/cm located at a distance of 15–20 cm, for 2 seconds. Thus, the covering resin 30 can be obtained.

Via the above process, the coin-shaped IC tag 10 is finished up. Since, in this case, the covering resin 30 is colorable, the appearance of design of the coin-shaped IC tag 10 can be enhanced by selecting a desired tint.

The thickness of the layer of the covering resin 30 may be about 0.2 mm. Therefore, in the case where the geometries of the coin are limited to a diameter of 30 mm and a thickness of 2 mm as explained before, the high specific gravity resin material 21 can be used in a sufficient amount to produce weightiness. It is accordingly possible to obtain the coin-shaped IC tag 10 affording a satisfactory feeling of weightiness.

In the embodiment described above, the PET resin film 22b can be replaced with the film material of a polyimide resin (PI), a polyphenylene sulfite resin (PPS), polyethylene naphthalate (PEN) or the like.

Also, the copper foil 22g can be replaced with an aluminum foil.

As the resin binder of the high specific gravity resin material 21 for mixing the metal powder, it is possible to use any of various resins such as a polyphenylene sulfite resin (PPS), a polycarbonate resin (PC), an acrylonitrile-butadiene styrene resin (ABS), a polymethyl methacrylate resin (PMMA), a polybutylene terephthalate resin (PBT), and "Nolyl" or a polyphenylene oxide resin (PPO). The binder to be selected, however, should be a material which can satisfactorily bond both between the film and the copper foil and between the film and the high specific gravity resin material.

In the foregoing fabrication of the IC tag core 20, an example was described in which the urethane-based binder 22f at both the surfaces of the IC packaging film 22 was used for bonding the three constituents of this IC packaging film 22 and the two molded compacts 21a formed of the high specific gravity resin material 21. As another example, the three constituents can be joined by utilizing a bonding power which is possessed by the binder resin itself for forming the two molded compacts 21a.

Figure 9A:
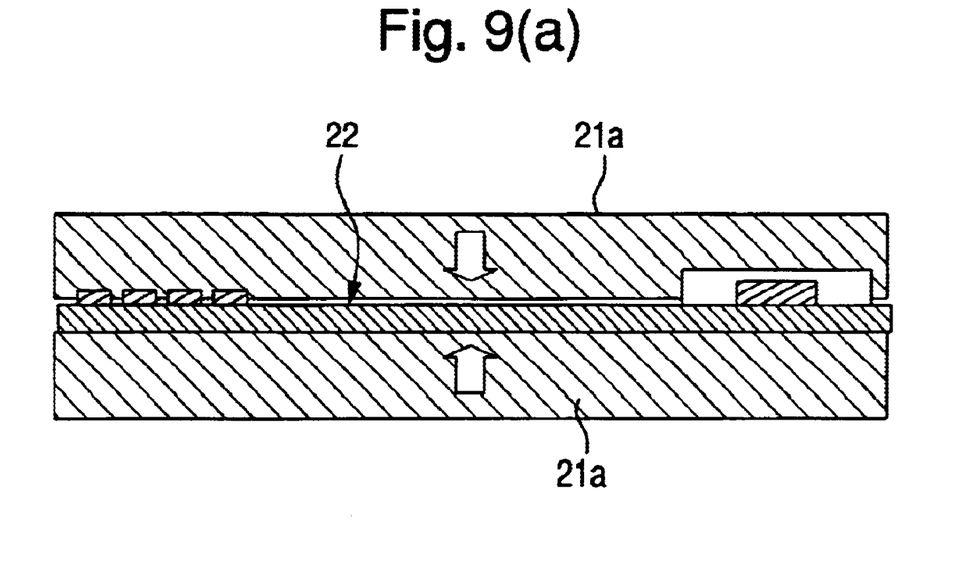
FIGS. 9(a) and 9(b) are sectional views for explaining the joining steps of another example of an IC tag core for an IC tag according to an embodiment of the invention.
Figure 9B:
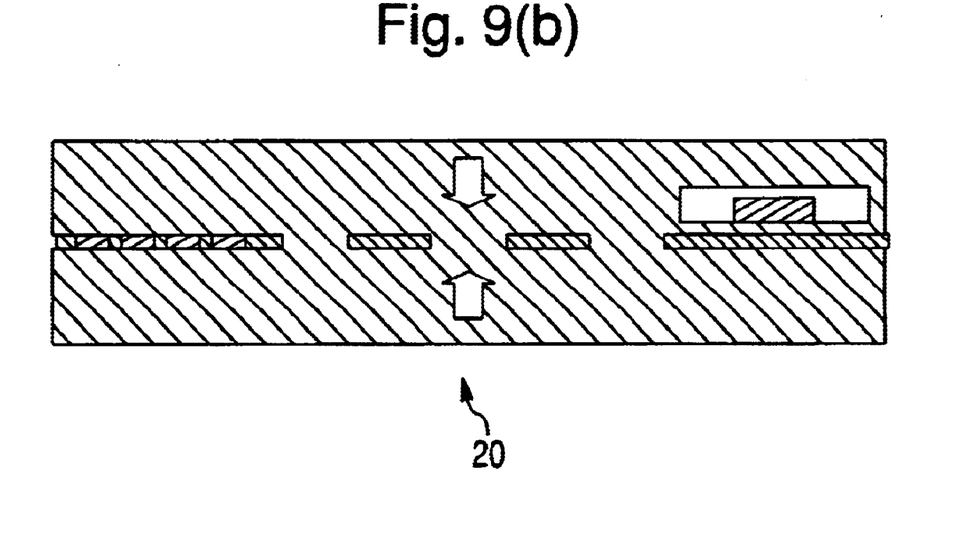

FIGS. 9(a) and 9(b) show the above example in which the three constituents are joined by utilizing the bonding power of the binder resin itself. In this example, PPS is employed as the binder resin constituting the high specific gravity resin material 21, and PET resin is employed for the film 22b of the IC packaging film 22.

As shown in FIG. 9(a), the IC packaging film 22, one surface of which has had the urethane-based binder 22f removed therefrom, is interposed between the two molded compacts 21a made of the high specific gravity resin material 21. In a state where the resulting structure is heated to a temperature of at least 240° C., it is loaded with a pressure of 20 kg/cm$^2$ for about 2 seconds. Then, the PET film material is melted and is partially removed from the interfaces between the IC packaging film 22 and the molded compacts 21a.

Subsequently, as shown in FIG. 9(b), the pressure is continually applied in the above state for about 3 seconds. Then, the molded compacts 21a come into contact with each other, and the interfaces are melted until the three constituents are bonded.

In this way, the IC tag core 20 can be manufactured. Although the binder resin components of the molded compacts 21a are fused and bonded by the heating in the above example, the fusion bonding may well be performed by projecting ultrasonic waves of, for example, 40 kHz.

Since the thickness of the layer of the covering resin 30 as explained before with reference to FIGS. 8(a) through 8(c) is sometimes unsatisfactory, a manufacturing method for thickening the covering resin 30 will be described below. The covering resin 30 can be thickened by forming the resin layer 30 in accordance with injection molding.

Figure 10A:
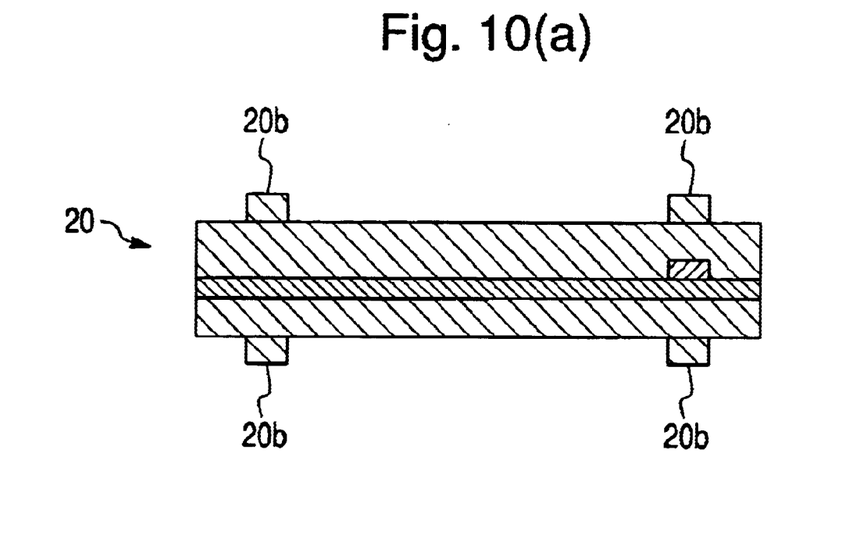
FIGS. 10(a) and 10(b) are sectional views for explaining the manufacturing steps of a resin covering in another example of a coin-shaped IC tag for an IC tag according to an embodiment of the invention.

As shown in FIG. 10(a), protrusions 20b, each of which is set at a height corresponding to the thickness of the layer of the covering resin 30 are formed on the upper and lower surfaces of the IC tag core 20. The protrusions 20b may be simultaneously formed during the formation of the molded compacts 21a of the high specific gravity resin material 21.

Figure 10B:
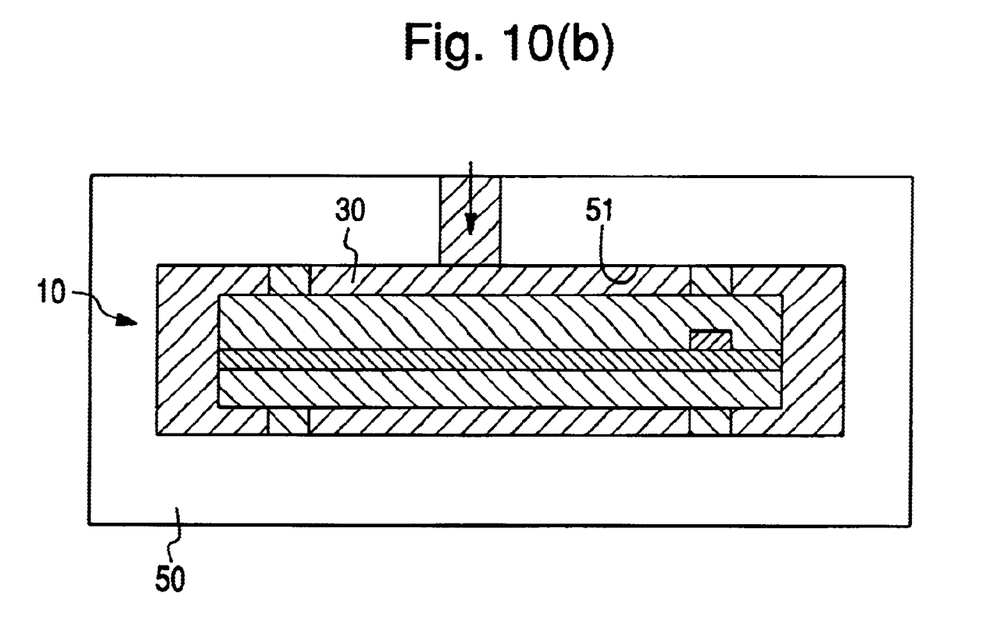

As shown in FIG. 10(b), the IC tag core 20 with the protrusions 20b, prepared as explained above, is set in the cavity 51 of a metal mold 50, and the starting resin of the covering resin 30 is poured into the metal mold 50. On this occasion, the protrusions 20b serve as the supporter of the IC tag core 20, and hence, the injection molding can be performed.

When the covering resin 30 is formed in this way, the height of each protrusion 20b becomes the thickness of the layer of the covering resin 30, and a sufficient thickness can be attained.

When the same kind of material as the binder resin of the high specific gravity resin material 21 forming the IC tag core 20 is used as the above material of the covering resin 30, the bonding strength between the IC tag core 20 and the covering resin 30 is heightened.

Figure 11A:
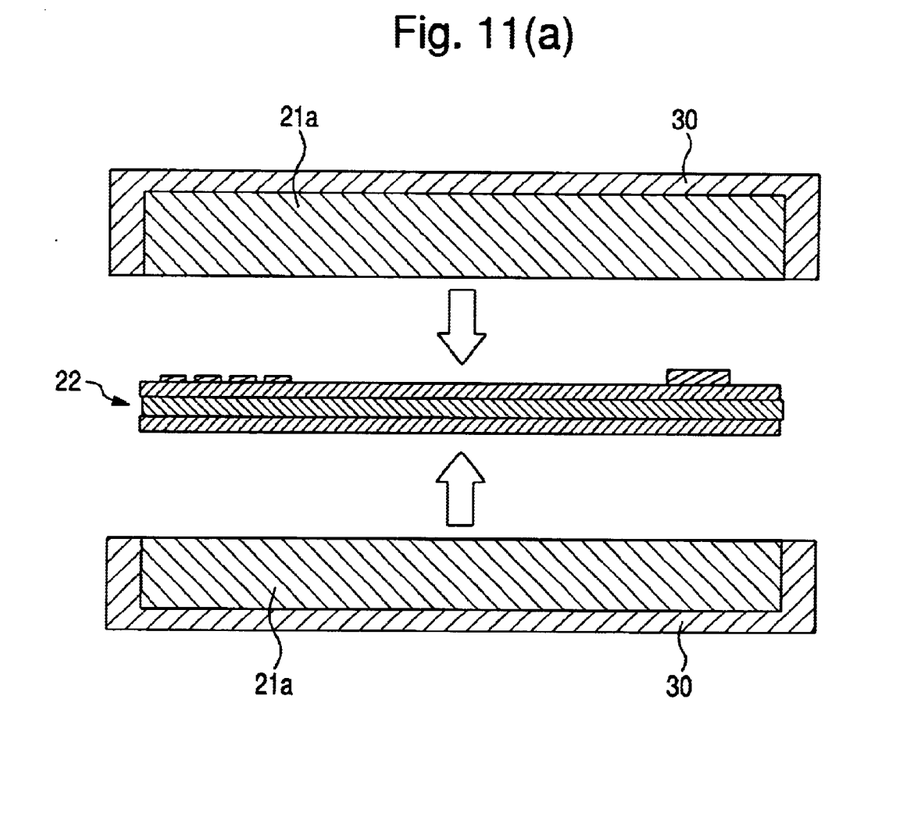
Figure 11B:
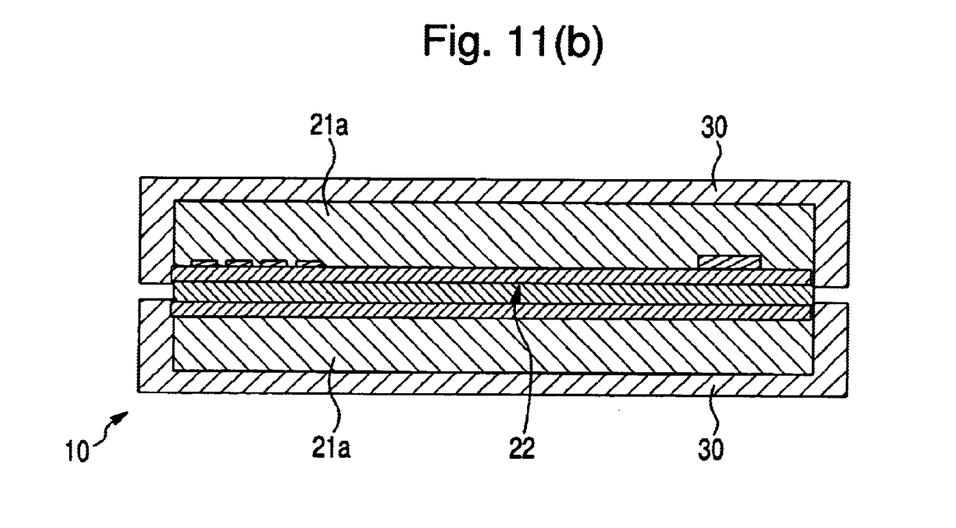

FIGS. 11(a) and 11(b) show another example of the manufacture of the coin-shaped IC tag 10. When the molded compacts 21a are formed of the high specific gravity resin material 21 by injection molding, each molded compact 21a and the covering resin 30 are simultaneously formed by dichroic molding, thereby covering the molded compact 21a with the covering resin 30.

As shown in FIG. 11(a), the IC packaging film 22 is sandwiched in between the pair of molded compacts 21a, 21a with the covering resin 30 prepared as explained above. Subsequently, as shown in FIG. 11(b), the three constituents are bonded. The bonding here can be done by bonding to any of the layers of the binder 22f applied at both the surfaces of the IC packaging film 22, using, for example, fusion bonding, or ultrasonic waves. The coin-shaped IC tag 10 can be manufactured in this way.

Figure 12:
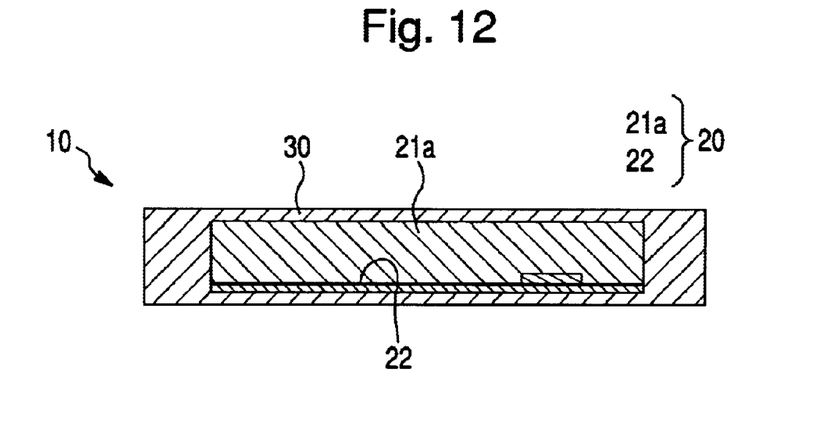
FIG. 12 is a sectional view showing another example of a coin-shaped IC tag for an IC tag according to an embodiment of the invention.

FIG. 12 shows another example of the coin-shaped IC tag 10. The IC packaging film 22 is joined onto either surface of one molded compact 21a formed of the high specific gravity resin material 21, and the whole surface of the resulting structure is covered with the covering resin 30. Here, considering the scratch resistance of the outer peripheral part of the coin-shaped IC tag 10, the circumferential part of this tag 10 is thickened in the radial direction thereof.

Figure 13:
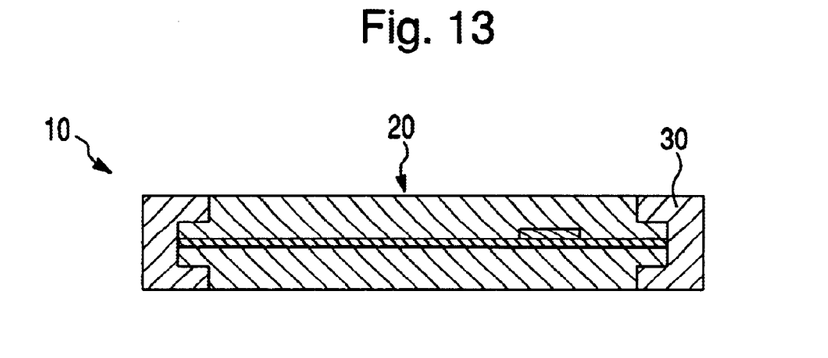
FIG. 13 is a sectional view showing still another example of a coin-shaped IC tag for an IC tag according to an embodiment of the invention.

FIG. 13 shows still another example of the coin-shaped IC tag 10. In this example, only the outer peripheral edge of the IC tag core 20 is covered with the covering resin 30.

Figure 14:
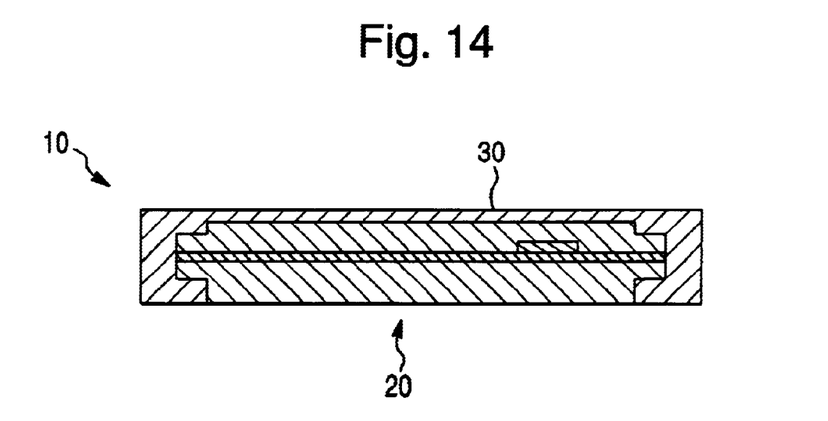
FIG. 14 is a sectional view showing yet another example of a coin-shaped IC tag for an IC tag according to an embodiment of the invention.

FIG. 14 shows yet another example of the coin-shaped IC tag 10. In this example, one surface and the outer peripheral edge of the IC tag core 20 are covered with the covering resin 30.

In this manner, the coin-shaped IC tags 10 as shown in FIG. 12, FIG. 13 and FIG. 14 can be formed.

As described above in detail, according to each of the coin-shaped IC tags 10 manufactured by the embodiments, since the coin-shaped IC tag 10 can be endowed with a predetermined weight, normal operation is ensured without an inferior operation ascribable to an insufficient weight, even in its use as a substitute for cash. Moreover, since the coin-shaped IC tag 10 can afford a satisfactory feeling of weightiness as a value medium, a feeling of valuableness of the coin-shaped IC tag as the substitute for cash is retained. Accordingly, the coin-shaped IC tag 10 can function satisfactorily as a substitute for cash.

Regarding the relations between the construction of this invention and the embodiments, the "IC packaging base member" of this invention corresponds to the IC packaging film 22 of the embodiments. Likewise, the "base material" corresponds to the PET film 22b. The "electronic circuit" corresponds to the antenna coil 22a and the electronic module 22e. However, this invention is not restricted only to the construction disclosed in the specific embodiments, but different embodiments are contemplated along the technical idea thereof.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A coin-shaped IC tag comprising:
   an IC packaging base member in which an electronic circuit for communicating data and for recording data is mounted on a base material;
   a high specific gravity resin material whose specific gravity is increased by mixing a material of high specific gravity into a resin material, and which is formed into a flat shape;
   an IC tag core which is formed by joining the high specific gravity resin material in the flat shape and said IC packaging base member; and
   a covering which is formed of a resin material at, at least, an outer peripheral edge of a surface of said IC tag core so as to present a coin shape, wherein the covering completely covers the outer peripheral edge of the surface of said IC tag core, and wherein the high specific gravity resin material has a specific gravity greater than that of the resin covering material.

2. A coin-shaped IC tag according to claim 1, wherein two members are formed of said high specific gravity resin material in said flat shape, and said IC tag core is formed by interposing said IC packaging base member between said two members.

3. A coin-shaped IC tag according to claim 1, wherein the resin material for covering the surface of said IC tag core so as to present the coin shape is colorable.

4. A coin-shaped IC tag comprising:
   an IC tag core, the IC tag core comprising:
      an IC packaging base member including a base and an electronic circuit for communicating data and for recording data, the electronic circuit mounted on the base;
      a high specific gravity resin layer joined to the IC packaging base member, and
      a covering which is formed of a resin material, the high specific gravity resin layer having a specific gravity greater than that of the resin covering material and less than about 8.

5. The coin-shaped IC tag according to claim 4, further comprising:
   a covering layer which is formed of a resin material at, at least, an outer peripheral edge of a surface of said IC tag core.

6. The coin-shaped IC tag according to claim 5, wherein the resin material of the covering layer comprises a colorable resin.

7. The coin-shaped IC tag according to claim 5, wherein the covering layer completely covers the IC tag core.

8. The coin-shaped IC tag according to claim 5, wherein the covering layer covers the outer peripheral edge of the IC tag core, but leaves a top surface of the IC tag core exposed.

9. The coin-shaped IC tag according to claim 5, wherein the covering layer covers the outer peripheral edge of the IC tag core, but leaves a top and bottom surface of the IC tag core exposed.

10. The coin-shaped IC tag according to claim 5, wherein the resin material of the covering layer comprises a urethane acrylate-based UV curable resin.

11. The coin-shaped IC tag according to claim 4, wherein the high specific gravity resin layer comprises a resin which is one of polyphenylene sulfite resin, polycarbonate resin, acrylonitrile-butadiene styrene resin, polymethyl methacrylate resin, polybutylene terephthalate resin, and polyphenylene oxide resin.

12. The coin-shaped IC tag according to claim 4, wherein the high specific gravity resin layer comprises a high specific gravity material which is one of tungsten, stainless steel, tantalum and ZnO.

13. The coin-shaped IC tag according to claim 4, wherein the coin-shaped tag has one of a circular and an oval shape.

14. The coin-shaped IC tag according to claim 4, wherein the high specific gravity layer has one of a disc and a polygon shape.

15. The coin-shaped IC tag according to claim 14, wherein the high specific gravity layer has one of a triangle and a tetragon shape.

16. The coin-shaped IC tag according to claim 4, wherein the base comprises polyethylene terephtalate resin.

17. The coin-shaped IC tag according to claim 4, wherein the electronic circuit comprises an antenna coil.

18. A coin-shaped IC tag comprising:
an IC tag core, the IC tag core comprising:
an IC packaging base member including a base and an electronic circuit for communicating data and for recording data, the electronic circuit mounted on the base;
a high specific gravity resin layer joined to the IC packaging base member, the high specific gravity resin layer having a specific gravity greater than about 2 and less than about 8.

19. The coin-shaped IC tag according to claim 18, further comprising:
a covering layer which is formed of a resin material at, at least, an outer peripheral edge of a surface of said IC tag core.

20. The coin-shaped IC tag according to claim 19, wherein the covering layer and the high specific gravity resin layer comprise the same material.

21. The coin-shaped IC tag according to claim 19, wherein the resin material of the covering layer comprises a colorable resin.

22. The coin-shaped IC tag according to claim 19, wherein the covering layer completely covers the IC tag core.

23. The coin-shaped IC tag according to claim 19, wherein the covering layer covers the outer peripheral edge of the IC tag core, but leaves a top surface of the IC tag core exposed.

24. The coin-shaped IC tag according to claim 19, wherein the covering layer covers the outer peripheral edge of the IC tag core, but leaves a top and bottom surface of the IC tag core exposed.

25. The coin-shaped IC tag according to claim 19, wherein the resin material of the covering layer comprises a urethane acrylate-based UV curable resin.

26. The coin-shaped IC tag according to claim 18, wherein the high specific gravity resin layer comprises a resin which is one of polyphenylene sulfite resin, polycarbonate resin, acrylonitnle-butadiene styrene resin, polymethyl methacrylate resin, polybutylene terephthalate resin, and polyphenylene oxide resin.

27. The coin-shaped IC tag according to claim 18, wherein the high specific gravity resin layer comprises a high specific gravity material which is one of tungsten, stainless steel, tantalum and ZnO.

28. The coin-shaped IC tag according to claim 18, wherein the coin-shaped tag has one of a circular and an oval shape.

29. The coin-shaped IC tag according to claim 18, wherein the high specific gravity layer has one of a disc and a polygon shape.

30. The coin-shaped IC tag according to claim 29, wherein the high specific gravity layer has one of a triangle and a tetragon shape.

31. The coin-shaped IC tag according to claim 18, wherein the base comprises polyethylene terephtalate resin.

32. The coin-shaped IC tag according to claim 18, wherein the electronic circuit comprises an antenna coil.

* * * * *